United States Patent
Chaichanavong et al.

(10) Patent No.: US 8,601,354 B1
(45) Date of Patent: Dec. 3, 2013

(54) METHODS AND APPARATUS FOR IDENTIFICATION OF LIKELY ERRORS IN DATA BLOCKS

(75) Inventors: Panu Chaichanavong, Mountain View, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/407,901

(22) Filed: Feb. 29, 2012

Related U.S. Application Data

(63) Continuation of application No. 11/936,578, filed on Nov. 7, 2007, now Pat. No. 8,145,983.

(60) Provisional application No. 60/864,878, filed on Nov. 8, 2006.

(51) Int. Cl.
   *H03M 13/41* (2006.01)
(52) U.S. Cl.
   USPC .................................................. 714/795
(58) Field of Classification Search
   USPC .................. 714/786, 792, 795, 796
   See application file for complete search history.

(56) References Cited

U.S. PATENT DOCUMENTS

| | | | |
|---|---|---|---|
| 5,341,387 A | 8/1994 | Nguyen | |
| 5,422,894 A | 6/1995 | Abe et al. | |
| 5,600,661 A | 2/1997 | Shimokoriyama | |
| 5,696,774 A | 12/1997 | Inoue et al. | |
| 5,848,076 A | 12/1998 | Yoshimura | |
| 6,282,690 B1 * | 8/2001 | McClellan et al. | 714/801 |
| 6,539,518 B1 | 3/2003 | Fang et al. | |
| 6,546,518 B1 * | 4/2003 | Leung et al. | 714/769 |
| 6,901,118 B2 | 5/2005 | Hocevar et al. | |
| 7,076,721 B2 | 7/2006 | Sawaguchi | |
| 7,237,173 B2 | 6/2007 | Morita et al. | |
| 7,370,262 B2 | 5/2008 | Hwang et al. | |
| 7,447,936 B2 | 11/2008 | Shiota et al. | |
| 2003/0101410 A1 * | 5/2003 | Betti et al. | 714/794 |

* cited by examiner

*Primary Examiner* — James C Kerveros

(57) ABSTRACT

Methods and apparatus are provided for processing a plurality of data blocks. In accordance with embodiments of the invention, a correction flag for each of the data blocks can be received, along with information on at least one error event for each of the data blocks. Using this received information, a search trellis corresponding to the data blocks can be determined. Determining the search trellis can include determining a plurality of branches and computing a branch metric for each of the branches. A search on the search trellis can be performed to identify at most one error event for each data block, where the search is based on the branch metrics.

22 Claims, 16 Drawing Sheets

METHODS AND APPARATUS FOR IDENTIFICATION OF LIKELY ERRORS IN DATA BLOCKS

CROSS-REFERENCE TO RELATED APPLICATION

This application is a continuation of, and claims the benefit of and priority to, U.S. patent application Ser. No. 11/936,578, filed Nov. 7, 2007 (now U.S. Pat. No. 8,145,983), which claims the benefit of and priority to, U.S. Provisional Application No. 60/864,878, filed Nov. 8, 2006 (now expired), each of which is incorporated herein by reference in its respective entirety.

BACKGROUND OF THE INVENTION

This invention can relate to processing data blocks. More particularly, this invention can relate to correcting errors detected in data blocks by identifying likely error events.

Data transmitted in and between data processing systems can be corrupted by errors caused by noise, jitter, or other factors. In order to detect and possibly correct these errors, many systems introduce a level of redundancy to the data. For instance, redundancy can be introduced through the use of a checksum, where the logical bits of each block of data are added together to generate a modular sum that is transmitted with the data. Data blocks and checksums can be any suitable number of bits. For instance, a single-bit checksum can be computed by determining a logical XOR of the bits of the corresponding data block.

When the data block is received, the logical bits of each received data block can again be added together according to the checksum equation, and the resulting sum can be compared to the checksum received for that block. If an inconsistency exists between the computed sum and the received checksum, then it is likely that an error was introduced into the data block or the checksum during transmission or receipt. For example, in one common implementation, a parity encoder can attach a checksum of zero to each data block before transmitting it over a channel. In this case, the received checksum should always be zero. As another example, if a tensor-product parity code is used, the received checksum can be provided by a parity-hiding code instead of a standard parity encoder. An indication of whether or not a received data block is consistent with its received checksum can be recorded as a "correction flag" that takes a certain value if no error is detected and another value if at least one error is detected.

In some systems, circuitry receiving the data can not only detect possible errors in the data blocks, but can also determine which logical bits in the data blocks were likely to be changed. Information about which bits may be corrupted can be represented by a multi-bit mask or "pattern." In addition, some systems can determine how likely it is that a certain pattern correctly identifies which bits have been corrupted. Information about this likelihood can be recorded as an "error-event metric." A pattern and its corresponding error event metric can together constitute an "error event."

Given a set of received data blocks, its correction flags, and its error event information, it is possible to identify the most likely set of error events that will correct the identified data errors. However, performing an exhaustive search through the possible combinations of error events can be very computationally intensive due to the relatively large number of possible combinations of error events across a relatively large number of data blocks.

In view of the foregoing, it would be desirable to provide methods and apparatus that can efficiently identify the most likely set of error events that will correct errors that have been identified in data blocks.

SUMMARY OF THE INVENTION

In accordance with this invention, methods and apparatus are provided for processing a plurality of data blocks. In accordance with embodiments of the invention, a correction flag for each of the data blocks can be received, where each correction flag indicates whether the corresponding data block satisfies at least one error-check criterion. In addition, information on at least one error event for each of the data blocks can be received. The information for each error event can include (1) a pattern identifying at least one logical bit of the corresponding data block and (2) an error-event metric indicating a likelihood that an error occurred in the at least one logical bit identified by the pattern.

Using this received information, a search trellis corresponding to the data blocks can be determined. Determining the search trellis can include determining a plurality of branches, where each branch corresponds to at least one data block and at least one error event of the corresponding at least one data block. Determining the search trellis can also include computing a branch metric for each of the branches, where each branch metric can be computed based on the correction flag of the corresponding at least one data block and the at least one error event of the corresponding at least one data block.

A search on the search trellis can be performed to identify at most one error event for each data block, where the search is based on the branch metrics. In certain embodiments of the invention, the search minimize the total branch metrics of the resulting path.

The invention therefore advantageously provides methods and apparatus for efficiently identifying the most likely set of error events that will correct errors that have been identified in data blocks.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
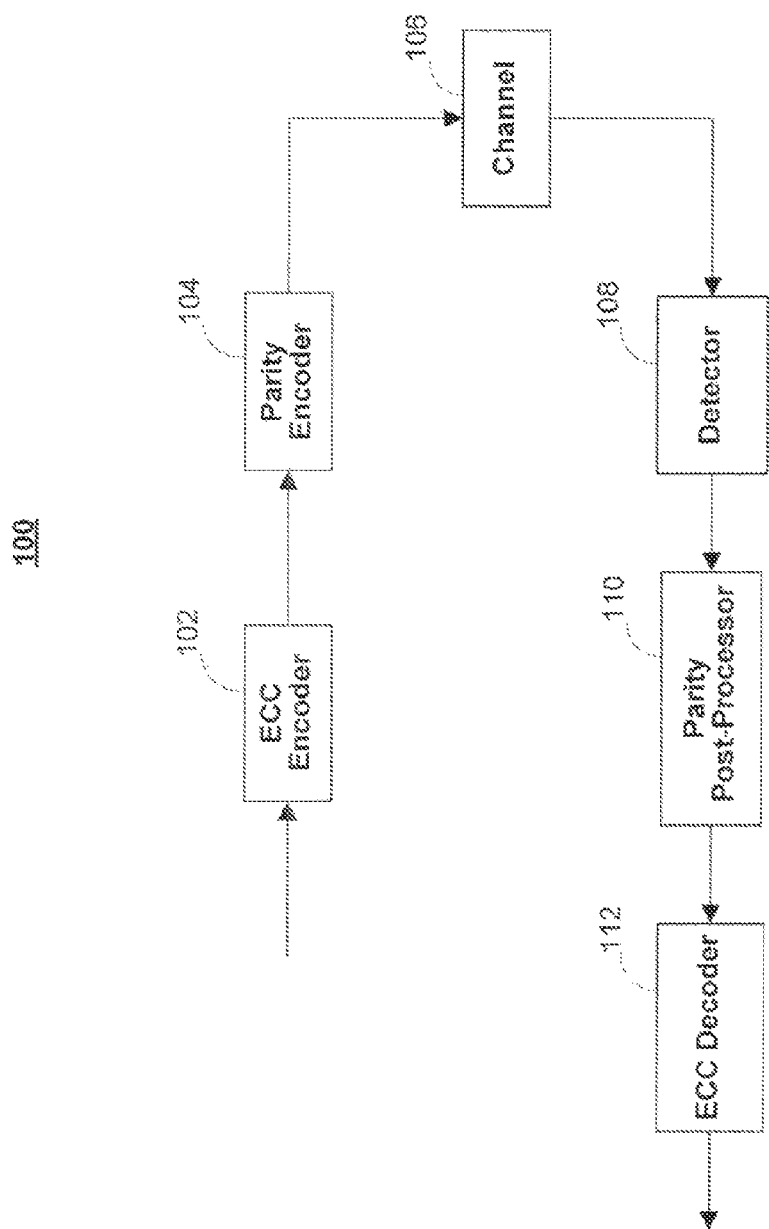
FIG. 1 is a block diagram showing an illustrative data processing system in accordance with embodiments of the invention.

FIG. 1 is a block diagram showing an illustrative data processing system 100 in accordance with embodiments of the invention. Data processing system 100 can be used in a variety of systems, including, for example, a magnetic recording system. Error-correction code ("ECC") encoder 102 can receive data that is to be transmitted and encode the data using any suitable scheme, such as Reed-Solomon encoding. The encoded data can be output from ECC encoder 102 and received by parity encoder 104, which can add redundancy to the encoded data by using, for example, parity bits generated through appropriate logical operations such as modular addition.

In some embodiments of the invention, parity encoder 104 can compute a checksum for each block of data received, where the block size and checksum size can be any suitable number of bits. For example, a single-bit checksum can be computed for a data block using a logical XOR operation. In some embodiments of the invention, multiple checksums can be computed for each data block, where the checksums may be overlapping (e.g., row and column checksums) or non-overlapping. The encoded data blocks and their corresponding parity information can be transmitted through channel 106, which may create errors in the data, their parity information, or both through noise, jitter, or similar phenomena.

Detector 108 can be operable to receive the data and parity information transmitted through channel 106 and estimate the logical values of that data and parity information. Parity post-processor 110 can receive the estimated data and parity information, determine if the parity information computed for a given data block matches the received parity information, and record the status of this information as a correction flag for the data block.

In accordance with embodiments of the invention, parity post-processor 110 can also determine which logical bits in the received data blocks were likely changed during transmission through channel 106. Information about which bits may be corrupted can be represented by a multi-bit pattern. Additionally, in accordance with embodiments of the invention, parity post-processor 110 can determine how likely it is that a certain pattern correctly identifies which bits have been corrupted. Information about this likelihood can be recorded as an error-event metric. A pattern and its corresponding error-event metric can together constitute an error event for the corresponding data block. Each data block can have one or more correction flags and one or more error events, depending on the requirements of the particular system and its application. In accordance with embodiments of the invention, parity post processor can use the correction flags and error events of the data blocks to identify the most likely set of error events that will correct errors that have been identified in data blocks. Such functionality will be discussed in greater detail below. Parity post-processor can utilize the identified set of error events to correct data that may be corrupted and transmit this corrected data to ECC decoder 112, which can be operable to decode the data using any suitable decoding scheme (e.g., a decoding scheme designed to substantially reverse the effects of ECC encoder 102).

Figure 2:
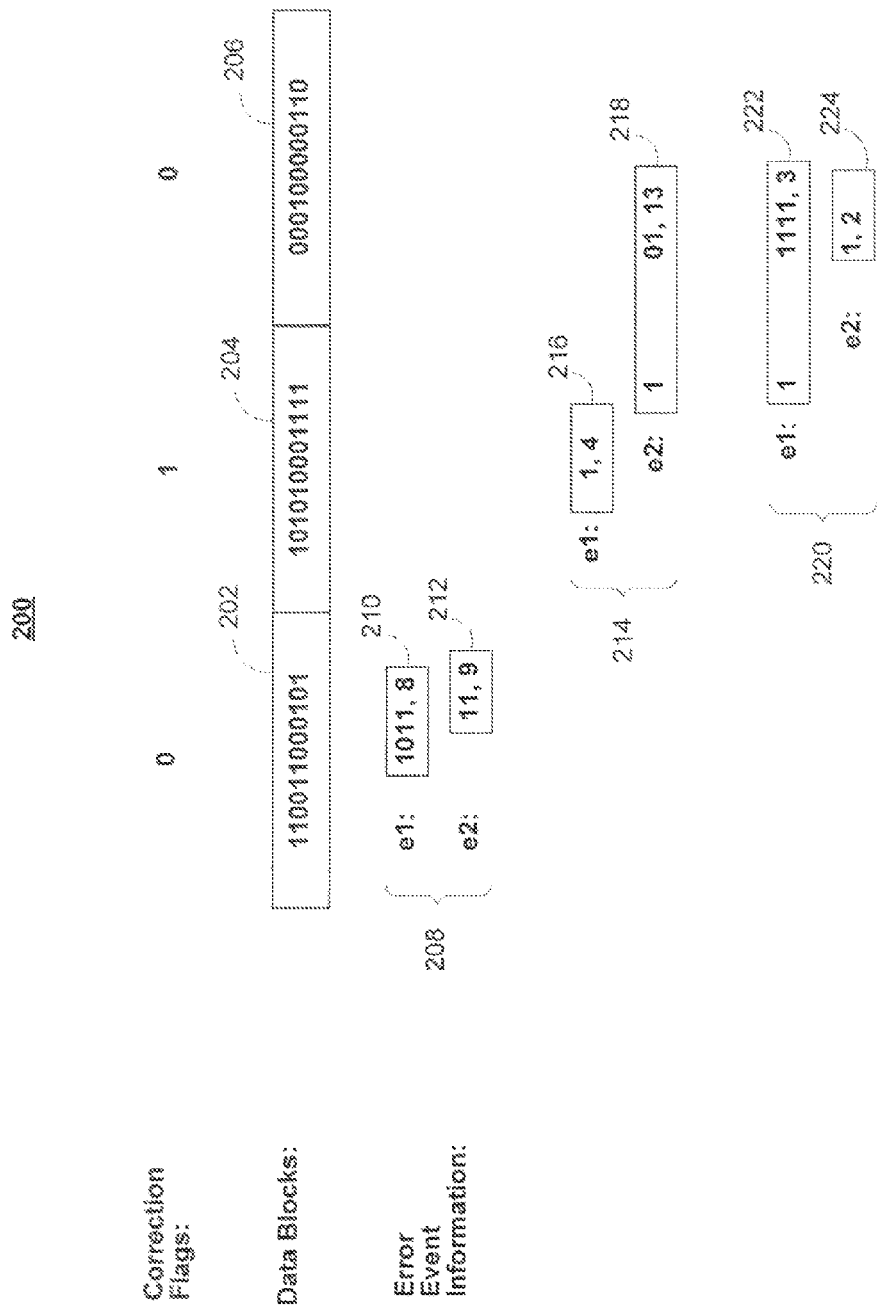
FIG. 2 is a diagram showing illustrative correction flags and error event information for data blocks in accordance with embodiments of the invention.

FIG. 2 is a diagram showing illustrative correction flags and error event information for data blocks 202, 204, and 206 in accordance with embodiments of the invention. As shown in FIG. 2, data blocks 202, 204, and 206 can each have twelve binary bits, although it will be understood that block sizes of any suitable size may be used in connection with the invention.

Each of data blocks 202, 204, and 206 can have a correction flag computed by any suitable circuitry, such as parity post-processor 110 of FIG. 1. Each correction flag can indicate, through its logical value, whether parity data computed from the corresponding data block matches the received parity data. For instance, a correction flag with a logical value of 0 can indicate that the computed parity data matches the received parity data for that data block, while a correction flag with a logical value of 1 can indicate that there is a discrepancy between the computed parity data and the received parity for that data block. Accordingly, in the example shown in FIG. 2, data block 204 may contain an error because its correction flag has a value of 1. In some embodiments of the invention, a correction flag can be computed by performing a bit-by-bit logical XOR operation between the computed parity data of a certain data block and the block's received parity data, where each set of parity data may contain multiple bits, and observing the result of the XOR operation. In some embodiments of the invention, multiple error-check criteria can be used for each data block, in which case several sets of parity data can be generated, and each correction flag can be a multi-bit vector of binary values.

Each data block can also have two corresponding error events e1 and e2, each of which includes an error-event pattern and an error-event metric. The pattern can include a sequence of bits that correspond to certain bits of the corresponding data block. For instance, error event 210 can include a pattern of "101" that corresponds to the fourth-, fifth-, and sixth-most-significant bits of data block 202. The pattern of error event 210 can indicate that the fourth- and sixth-most-significant bits of data word 202 may be incorrect. The error-event metric of an error event can indicate the likelihood that the pattern of the error event accurately reflects an error in the corresponding data word. In some embodiments of the invention, an error-event metric with a relatively low value can indicate a relatively high probability that the pattern of the error event reflects an error that actually occurred. As such, in the example of FIG. 2, error event 210 would be more likely than error event 212.

In some embodiments of the invention, the same number of error events is computed for each data block. For instance, in the illustrative example shown in FIG. 2, two error events (denoted e1 and e2) can be computed for each data block. It will be understood that an error event for a given data block can include a pattern that overlaps into an adjacent data block. For instance, error event 218, while corresponding to data block 204, can contain a pattern with one bit corresponding to the least-significant bit of data block 204 and two bits corresponding to the two most-significant bits of data block 206. Data blocks, in conjunction with their corresponding correction flags and error event information, can be used to identify data corrections that are relatively likely to correct errors in the data blocks, as discussed in further detail below.

Figure 3:
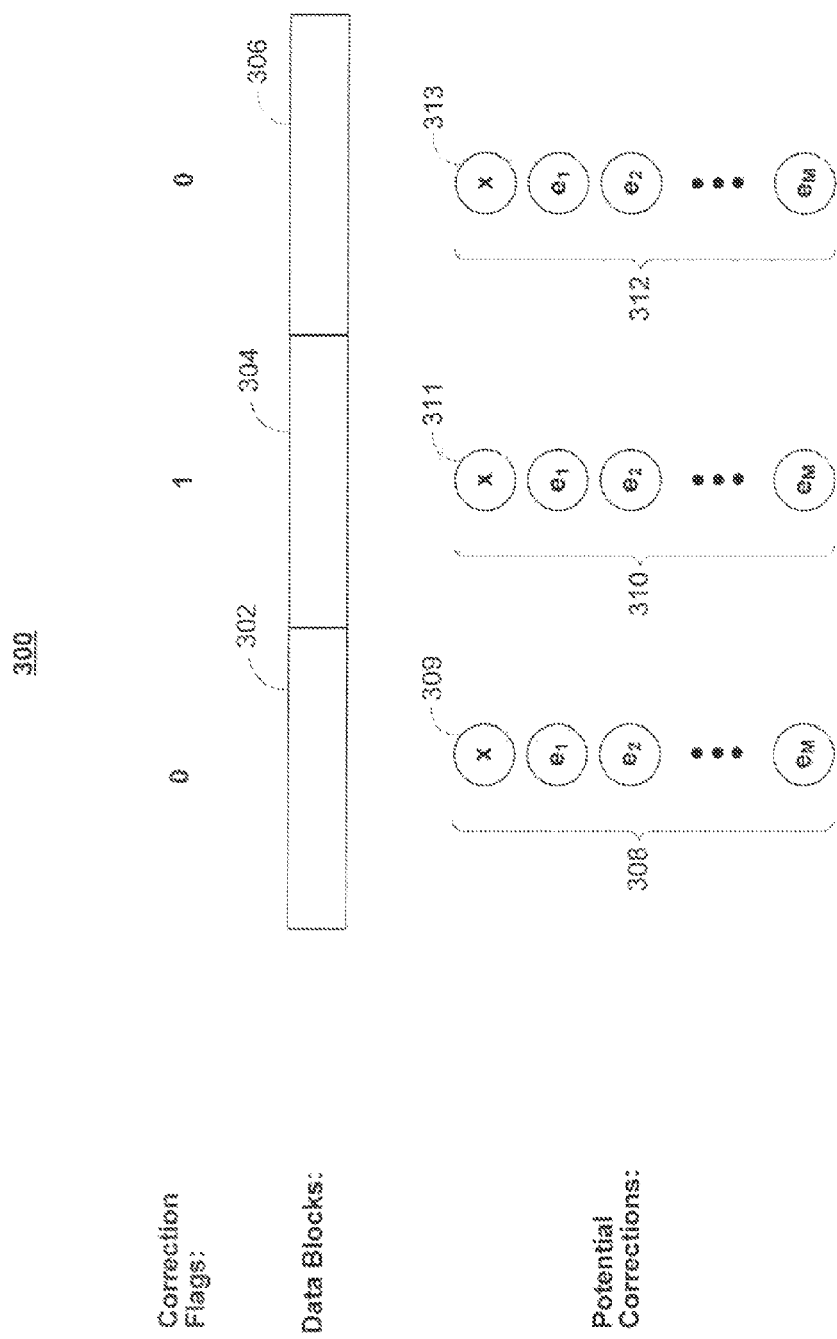
FIG. 3 is a diagram showing sets of potential corrections for data blocks in accordance with embodiments of the invention.

FIG. 3 is a diagram showing sets of potential corrections for data blocks 302, 304, and 306 in accordance with embodiments of the invention. As noted above in connection with FIG. 2, the same number of error events can be computed for each data block. In the example of FIG. 3, M error events can be computed for each data block, representing possible data corrections for that data block. In addition, a system can opt to not perform any correction whatsoever on a data block (e.g., if its correction flag indicates that the block's computed parity data matches its received parity data), a possibility denoted in FIG. 3 by "X" (e.g., in events 309, 311, and 313). As such, there are M+1 possible corrections for each data block. If one lets "N" denote the number of data blocks received by a system in a given period of time, there exists $(M+1)^N$ possible correction sequences that can be applied across all N data blocks. Some of these possible sequences will be more likely than others to generate a correct data set, depending, for example, on whether a given data block has a correction flag that indicates that an error occurred (e.g., if no error has been detected, making no correction may be most desirable), whether a given error-event pattern yields a correction that will fix a detected error, and the likelihood that a selected error event actually reflects the error that occurred (a likelihood that can be indicated by the error-event metric). In accordance with embodiments of the invention, techniques can be applied that facilitate the detection of an optimal or high-likelihood sequence of error events in a way that can be computationally more efficient than performing an exhaustive search through all $(M+1)^N$ possible correction sequences.

Figure 4:
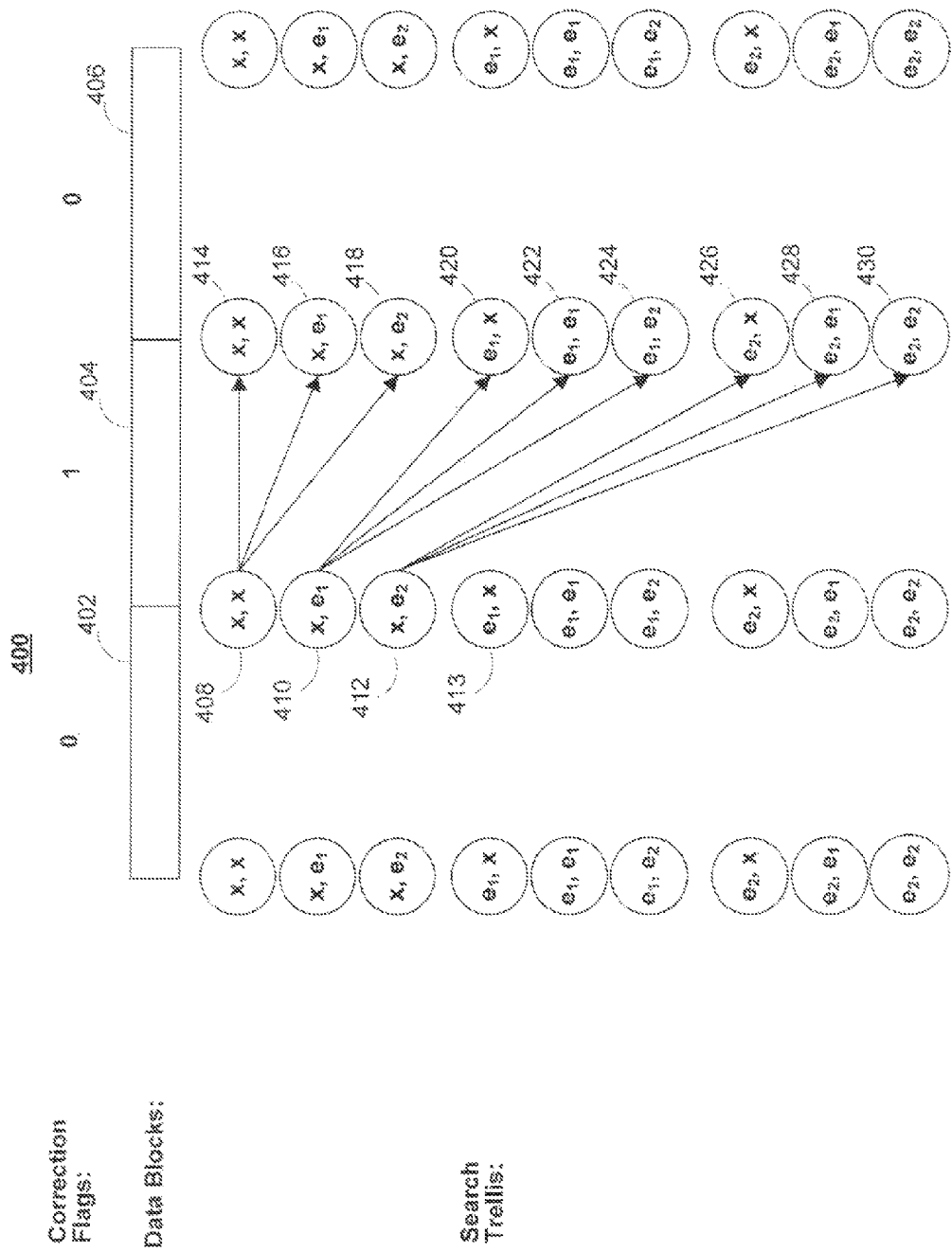
FIG. 4 is a diagram showing a search trellis that is determined in accordance with embodiments of the invention.

FIG. 4 is a diagram showing a search trellis that is determined in accordance with embodiments of the invention. For simplicity of illustration, it is assumed that two error events are computed for each data block, although concepts of the invention can be applied to systems that compute any number of error events per block. In accordance with embodiments of the invention, a search trellis can be formed, where each state of the trellis can correspond to two consecutive selections of error events. Thus, for example, search trellis state 408 can correspond to making no correction to data block 402 and no correction to data block 404. Similarly, state 410 can correspond to making no correction to data block 402 and a correction corresponding to error event e1 for data block 404.

As illustrated in FIG. 4, the search trellis can also include branches connecting pairs of states in the trellis, where each branch can represent a transition between its two states. For example, the search trellis can include branches extending from state 408 to states 414, 416, and 418. It should be noted that the second error event of a given state must match the first error event of the next state. For example, state 408 corresponds to making no correction in data block 404, as does each of states 414, 416, and 418. In contrast, state 420 corresponds to making a correction in data block 404 that corresponds to error event e1, so a branch connecting state 408 to state 420 would yield conflicting error-event selections for data block 404. Applying these observations, branches can also be established from state 410 to states 420, 422, and 424, and from state 412 to states 426, 428, and 430. It will be noted that most branches in the search trellis illustrated in FIG. 4 have been omitted for clarity of illustration. For example, the search trellis would also include branches extending from state 413 to states 414, 416, and 418.

After a trellis of states and branches is determined, an appropriate search algorithm (e.g., a Viterbi search algorithm) can be run on the trellis in order to find an optimal path through the trellis and identify an optimal sequence of corrections that corresponds to this path. To facilitate this search, the branches of the trellis can be provided with weights, or "metrics" that can distinguish error events representing relatively high-likelihood errors from error events representing relatively low-likelihood errors. Computation of such branch metrics is discussed in further detail below.

Figure 5:
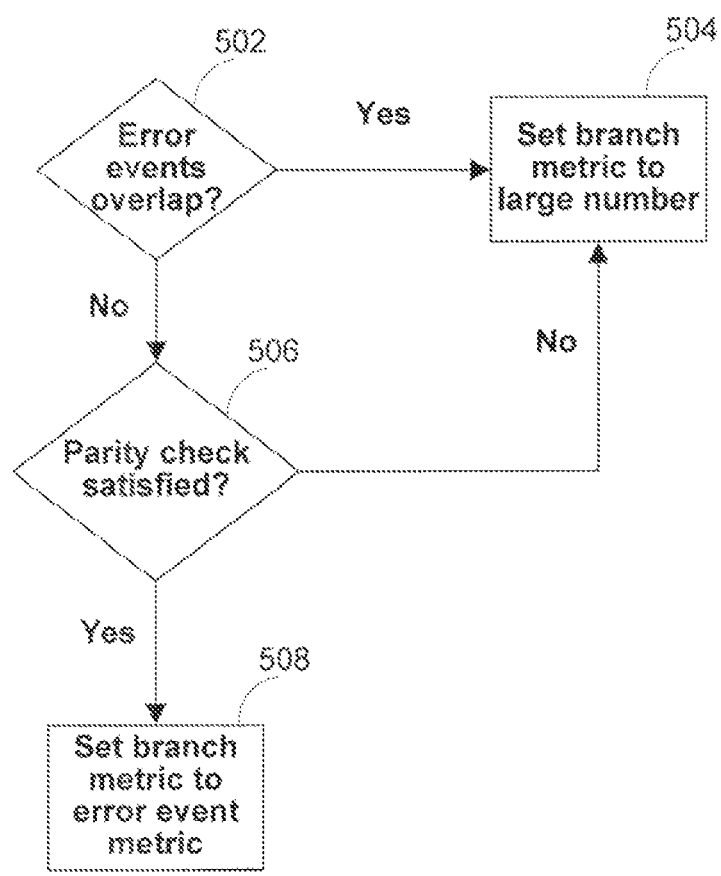
FIG. 5 is a flow chart showing a method for computing a branch metric for a search trellis in accordance with embodiments of the invention.

FIG. 5 is a flow chart showing a method 500 for computing a branch metric for a search trellis in accordance with embodiments of the invention. In step 502, it can be determined whether two error events corresponding to the branch "overlap" with each other (e.g., include patterns that have at least one bit in common). For example, the two error events corresponding to the state from which the branch originates can be examined for overlap. As another example, the two error events corresponding to the state at which the branch terminates can be examined for overlap. In some embodiments of the invention, step 502 can determine not only whether two error events overlap with each other, but whether there is at least a certain number of bits between the two error events. For instance, characteristics of channel 106 (e.g., the amount of "memory" of channel 106) may dictate that two error events should be separated by at least a certain number of bits. As an example, if it is determined that error events should be separated by at least two bits, error events that are only one bit apart will still be considered to be "overlapping" when step 502 is performed. If it is determined at step 502 that there is overlap between the two error events examined, method 500 can proceed to step 504, where the branch metric for the branch can be set to a relatively large number, making it relatively unlikely that the search algorithm will select this particular branch. Such an action may be desirable, for example, because making corrections corresponding to two error events that overlap may cause undesirable effects (e.g., a beneficial result of a correction from one error event may be canceled out by a correction from an overlapping error event). On the other hand, if it is determined at step 502 that the two error events do not overlap, method 500 can proceed to step 506.

At step 506, it can be determined whether the three consecutive error events corresponding to the branch would yield a correction that satisfies a parity-check criterion (or any other suitable error-check criterion). For example, the error events corresponding to (1) the first error event in the branch's originating state, (2) both the second error event in the branch's originating state and the first error event in the branch's terminating state, and (3) the second error event in the branch's terminating state can be examined to determine if it would correct an error in the corresponding data blocks (e.g., yield computed parity data that matches the received parity data for those data blocks). If the parity check would not be satisfied, method 500 can again proceed to step 504, where the branch metric for the branch can be set to a relatively large-number, making it relatively unlikely that the search algorithm will select this particular branch. On the other hand, if the parity check would be satisfied by those particular error events, method 500 can proceed to step 508, where the branch metric can be set to the metric of the middle error event examined at step 506 (i.e., the error event corresponding to both the second error event in the branch's originating state and the first error event in the branch's terminating state). If the middle error event happens to be "X" (corresponding to no correction), then the branch metric can be set to zero. Step 508 can advantageously provide a metric or weight to the branch that reflects the likelihood of the corresponding error event, thereby providing information that can facilitate the search for an optimal sequence of error events.

Figure 6:
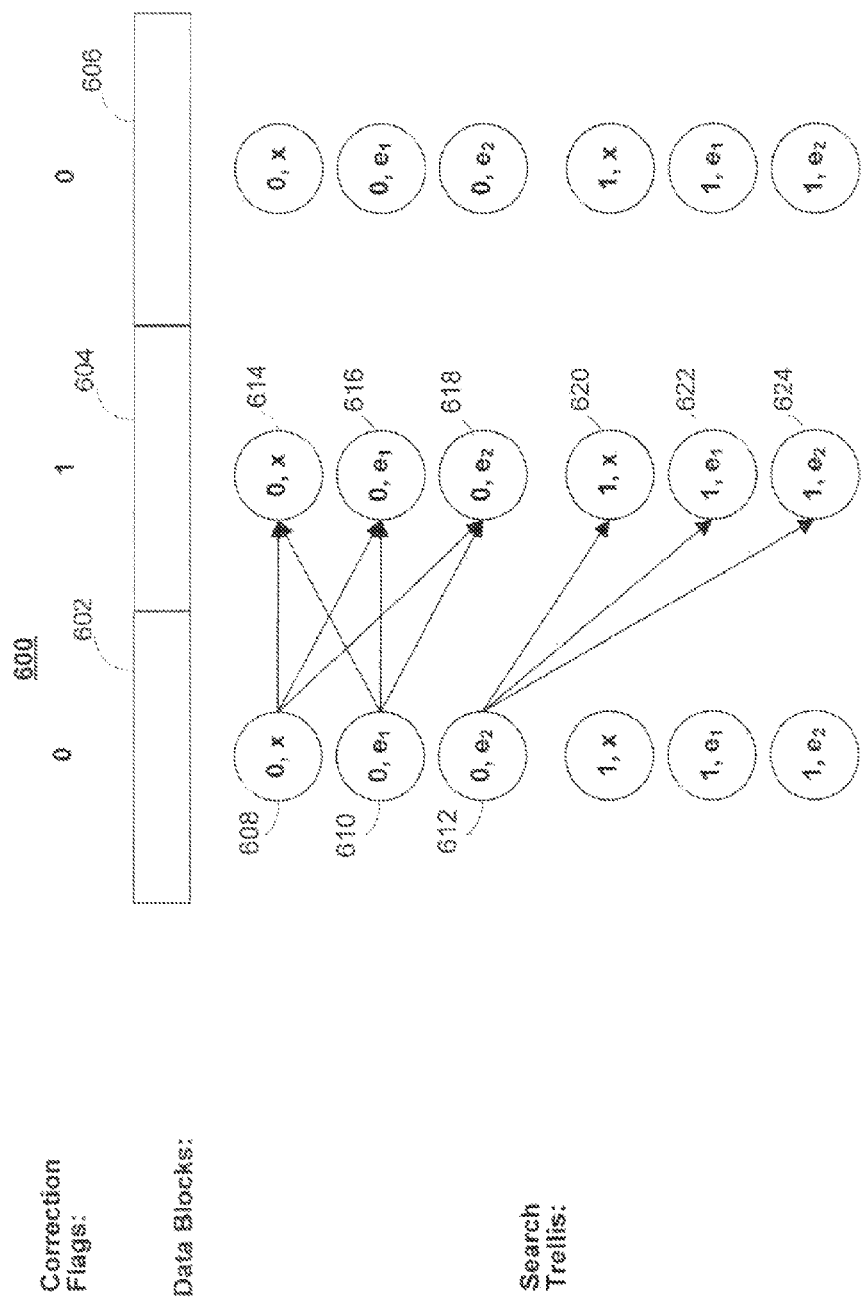
FIG. 6 is a diagram showing another search trellis that is determined in accordance with embodiments of the invention.

FIG. 6 is a diagram showing another search trellis that is determined in accordance with embodiments of the invention. The search trellis illustrated in FIG. 6 can advantageously reduce the number of states in the trellis for each data block from $(M+1)^2$, as shown in FIG. 4, to $2(M+1)$. In accordance with embodiments of the invention, each state in a given data block can correspond to (1) whether the pattern of an error event from the previous data block overlaps into the current data block, and (2) an error event in the current data block. Branches for this reduced-state trellis can be consistent with this convention.

For instance, in the illustrative example of FIG. 6, error event e1 of data block 602 can include a pattern that does not include any bits overlapping into data block 604. Accordingly, the branches originating from state 610 can terminate at states 614, 616, and 618, each of which can include a designation of "0" in FIG. 6, indicating that the pattern of the error event from previous data block 602 does not overlap into current data block 604. In contrast, in the illustrative example of FIG. 6, error event e2 of data block 602 can include a pattern that has bits overlapping into data block 604. Accordingly, the branches originating from state 612 can terminate at states 620, 622, and 624, each of which can include a designation of "1" in FIG. 6, indicating that the pattern of the error event from previous data block 602 does overlap into current data block 604.

After a trellis of states and branches is determined, an appropriate search algorithm (e.g., a Viterbi search algorithm) can be run on the trellis in order to find an optimal path through the trellis and identify an optimal sequence of corrections that corresponds to this path. To facilitate this search, the branches of the trellis can be provided with metrics that can distinguish error events representing relatively high-likelihood errors from error events representing relatively low-likelihood errors. Computation of such branch metrics is discussed in further detail below.

Figure 7:
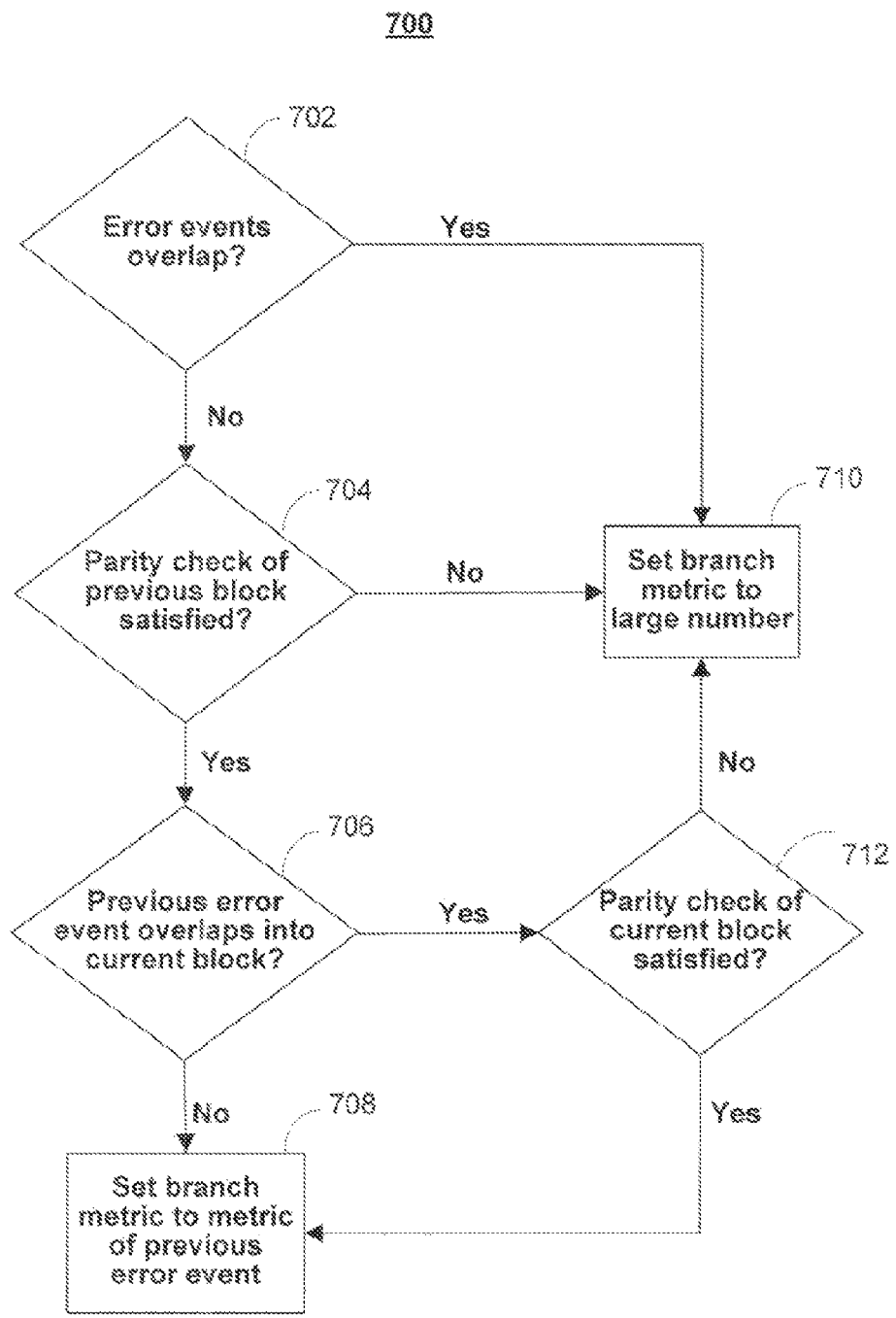
FIG. 7 is a flow chart showing another method for computing a branch metric for a search trellis in accordance with embodiments of the invention.

FIG. 7 is a flow chart showing another method 700 for computing a branch metric for a search trellis in accordance with embodiments of the invention. In step 702, it can be determined whether two error events corresponding to the branch overlap with each other. For example, the error event of the branch's originating state can be examined for overlap with the error event of the branch's terminating state. In some embodiments of the invention, step 704 can determine not only whether two error events overlap with each other, but whether there is at least a certain number of bits between the two error events. If overlap is detected, method 700 can proceed to step 710, where the branch metric for the branch can be set to a relatively large number, making it relatively unlikely that the search algorithm will select this particular branch. Such an action may be desirable, for example, because making corrections corresponding to two error events that overlap may cause undesirable effects (e.g., a beneficial result of a correction from one error event may be canceled out by a correction from an overlapping error event).

If it is determined at step 702 that the two error events corresponding to the branch do not overlap, method 700 can proceed to step 704. At step 704, it can be determined whether a parity-check criterion (or any other suitable error-check criterion) is satisfied by a correction corresponding to the error event of the branch's originating state, which corresponds to the previous data block. For example, the error event corresponding to the branch's originating state can be examined to determine if it would correct an error in the previous data block (e.g., yield computed parity data that matches the received parity data for that data block). If that parity check is not satisfied, method 700 can again proceed to step 710, where the branch metric for the branch can be set to a relatively large number, making it relatively unlikely that the search algorithm will select this particular branch.

If it is determined at step 704 that the parity check corresponding to the error event of the branch's originating state is not satisfied, method 700 can proceed to step 706. At step 706, it can be determined whether the pattern of the error event of the branch's originating state, which corresponds to the previous data block, overlaps into the data block of the branch's terminating state (referred to as the "current data block"). If so, method 700 can proceed to step 712, where it can be determined whether a parity-check criterion (or any other suitable error-check criterion) is satisfied by a correction corresponding to the error event of the branch's terminating state (e.g., yield computed parity data that matches the received parity data for the current data block), despite the overlap of the previous error event into the current data block. If not, method 700 can again proceed to step 710, where the branch metric for the branch can be set to a relatively large number, making it relatively unlikely that the search algorithm will select this particular branch.

On the other hand, if it is determined at step 712 that the parity check would be satisfied by the error event corresponding to the branch's terminating state, method 700 can proceed to step 708, where the branch metric can be set to the metric of the error event examined at step 704. Similarly, if at step 706 it is determined that the pattern of the error event of the branch's originating state, which corresponds to the previous data block, does not overlap into the data block of the branch's terminating state, which corresponds to the current data block, method 700 can proceed to step 708, where the branch metric can be set to the metric of the error event examined at step 704. Step 708 can advantageously provide a metric or weight to the branch that reflects the likelihood of the corresponding error event, thereby providing information that can facilitate the search for an optimal sequence of error events.

It will be noted that, in accordance with embodiments of the invention, optimizations can be performed that trade off a relatively small amount of accuracy for a relatively large amount of computational savings. For instance, instead of computing and storing branch metrics for branches in a search trellis, the branches corresponding to a given data block can be sorted, which can advantageously permit the metrics themselves to be discarded in favor of numerical rankings, thereby resulting in computational and storage savings. As one example of how this concept may be implemented, the error events $e_1, e_2, \ldots e_M$ can be sorted by their error-event metrics, such that the resulting list of error events begins with the lowest-metric error event. At that point, the original metrics may be discarded. When the branch metrics are computed, a metric of 1 can be assigned to the first error event in the sorted list, a metric of 2 can be assigned to be second error event, and so forth, such that the maximum error-event metric can be equal to M.

Figure 8:
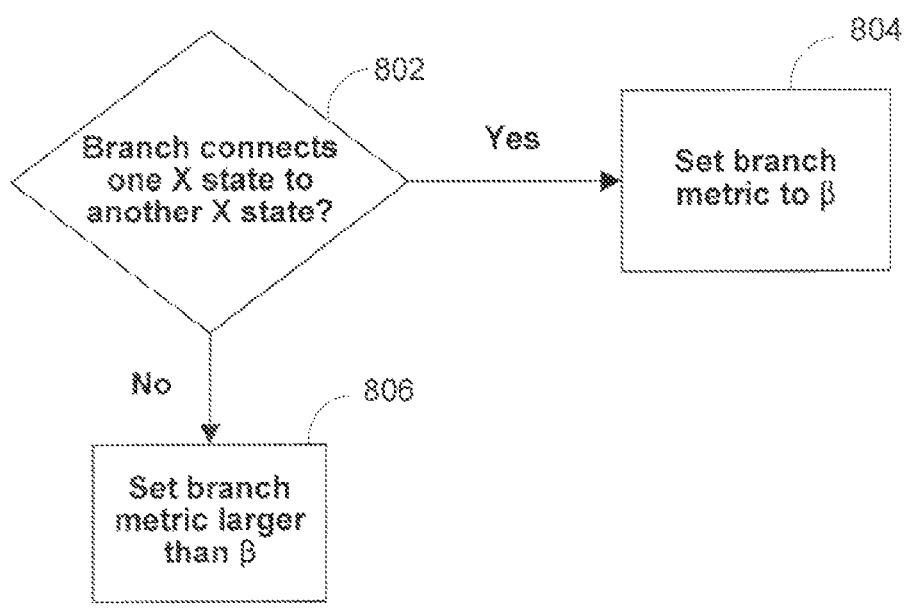
FIG. 8 is a flow chart showing a method for setting a relatively large branch metric for a search trellis in accordance with embodiments of the invention.

FIG. 8 is a flow chart showing another method 800 for setting a relatively large branch metric for a search trellis in accordance with embodiments of the invention. Method 800 can advantageously allow embodiments of the invention to distinguish between different search trellis paths that include branches with relatively high metrics. For instance, method 800 can advantageously permit ties between relatively-high-metric paths to be broken in favor of paths that perform no correction at all (e.g., paths that pass through states designated with an "X" in FIGS. 5 and 7).

At step 802, it can be determined whether the branch connects a no-correction state (generally denoted herein with an "X," instead of an error event indicator such as "e1") to another no-correction state. If so, the branch metric can be set to a relatively large number "β." In some embodiments, β can be a set function of M or of the maximum error-event metric in the system, in order to conserve system memory. For instance, β can be set to be one more than three times the maximum error-event metric in the system. This value can ensure that the search algorithm will not choose a path containing a branch with a branch metric β over a path that does not contain a branch with a branch metric β. As another example, β can be set to be one more than the maximum error-event metric in the system. This value can be used to achieve relatively good performance without much performance degradation relative to the case where β is set to one more than three times the maximum error event metric. It will be noted that, if true error-event metrics are discarded in favor of indices that result from sorting the error events as described above, the maximum error-event metric will be equal to M, in which case p can be set to M+1. On the other hand, if it is determined that the branch does not connect two no-correction states to each other, method 800 can proceed to step 806, where the branch metric can be set to a number larger than β in order to make that branch less likely to be chosen than the no-correction branches when the trellis is searched.

Setting a branch metric to be a relatively large number (e.g., in step 806) can require relatively high complexity in the circuitry used to perform processes of the invention (e.g., adder and comparator circuitry). As an alternative, an extra bit can be added to the metric of each branch, where that bit can correspond to an indication of whether the branch should have a relatively high metric. Similarly, an extra bit can be added to the metric of each path, where that bit can corresponding to an indication of whether the path contains a high-metric branch. In choosing between two paths, a path with the extra bit set to "0" will always be chosen over a path with the extra bit set to "1." Such a scheme could permit savings in computational resources and memory when compared to schemes that require the actual branch metric to be set to a relatively large number.

Figure 9:
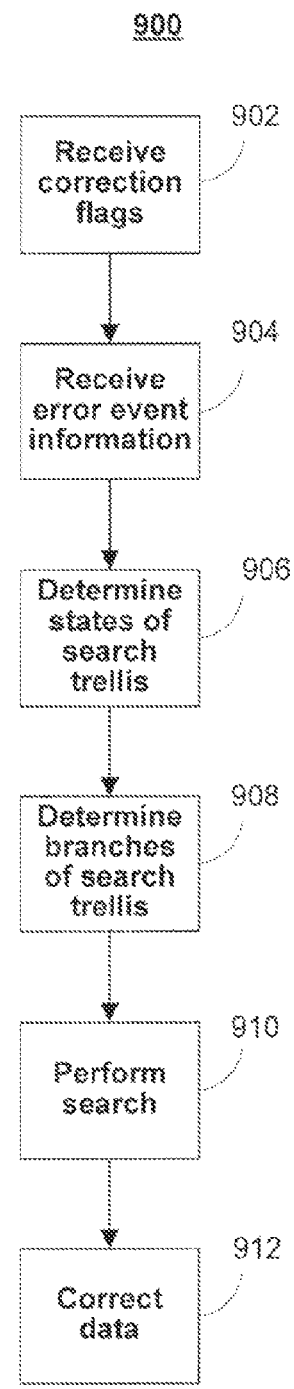
FIG. 9 is a flow chart showing a method for identifying likely errors in data blocks in accordance with embodiments of the invention.

FIG. 9 is a flow chart showing a method 900 for identifying likely errors in data blocks in accordance with embodiments of the invention. In step 902, correction flags for at least one data block can be received. As discussed above, a correction flag for a data block can indicate whether parity data computed on the received data bits of a data block match the received parity data for that block. In some embodiments of the invention, more than one error-check criterion can be used for each data block, which can result in a multi-bit vector of correction flags. Method 900 can then proceed to step 904.

At step 904, error event information for the data blocks can be received. Such error event information can be computed, for example, by circuitry such as detector 108 of FIG. 1, or by any other suitable circuitry. As discussed above, such error event information can include a multi-bit pattern indicating which bits of a data block (or data blocks) can be changed in connection with that particular error event, as well as a numerical indication of the likelihood that the pattern reflects bit changes resulting from transmission of the data blocks through a channel or other causes. Method 900 can then proceed to step 906.

At step 906, states of a search trellis can be determined. For instance, states of a trellis can be formed in accordance with either FIG. 4 or FIG. 6 and its corresponding description. It will be understood that other search trellis states can be utilized in accordance with embodiments of the invention. For example, a search trellis state can additionally correspond to an indication of whether a branch originating or terminating at that state should have a relatively large metric (e.g., the branch corresponds to two error events that overlap, or to an error event whose pattern would not correct a detected parity error). Method 900 can then proceed to step 908.

At step 908, branches of the search trellis can be determined. For instance, the connections between the trellis states that were determined in step 906 and the branches determined by step 908 can be formed in accordance either FIG. 4 or FIG. 6 and its corresponding description. Furthermore, the metrics of those branches can be computed in accordance with any of FIGS. 5, 7, and 8 and its corresponding description. Method 900 can then proceed to step 910.

At step 910, a search can be performed on the trellis formed at steps 906 and 908, in order to identify a path through the trellis that satisfies certain conditions. For example, it may be required that any error events selected by the path not overlap with each other, that selected error events correct a detected error-check criterion for a corresponding data block, and that the identified path have a cumulative branch metric (computed by summing up its component branch metrics) that is at most that of any other path that satisfies the other conditions. In some embodiments of the invention, the search performed can be a Viterbi search. Also, in some embodiments of the invention, the data blocks covered by the search can be dependent on whether the data block satisfies an error-check criterion. For example, a trellis can be formed that starts one or two data blocks before the first data block possessing a detected parity-check error, and ends one or two data blocks after the last data block possessing a detected parity-check error. Such an approach can advantageously save power and computing time by avoiding unnecessary operations such as the computation of branch metrics for branches that correspond to already-correct data blocks. Method 900 can then proceed to step 912.

At step 912, the search trellis path identified in step 910 can be used to correct errors in the corresponding data blocks by making changes identified by the bit patterns of selected states and branches. Advantageously, because of the way the search is performed in step 910, such corrections can have a relatively high probability of correcting any errors that have been detected.

It will be understood that FIGS. 1-9 and the corresponding description is intended to be merely illustrative, and other variations are possible. For example, steps of FIGS. 5, 7, 8, and 9 can be reordered or omitted as appropriate without deviating from the spirit or scope of the invention. Still other variations and changes are contemplated in accordance with embodiments of the invention.

Referring now to FIGS. 10A-10G, various exemplary implementations of the present invention are shown.

Figure 10A:
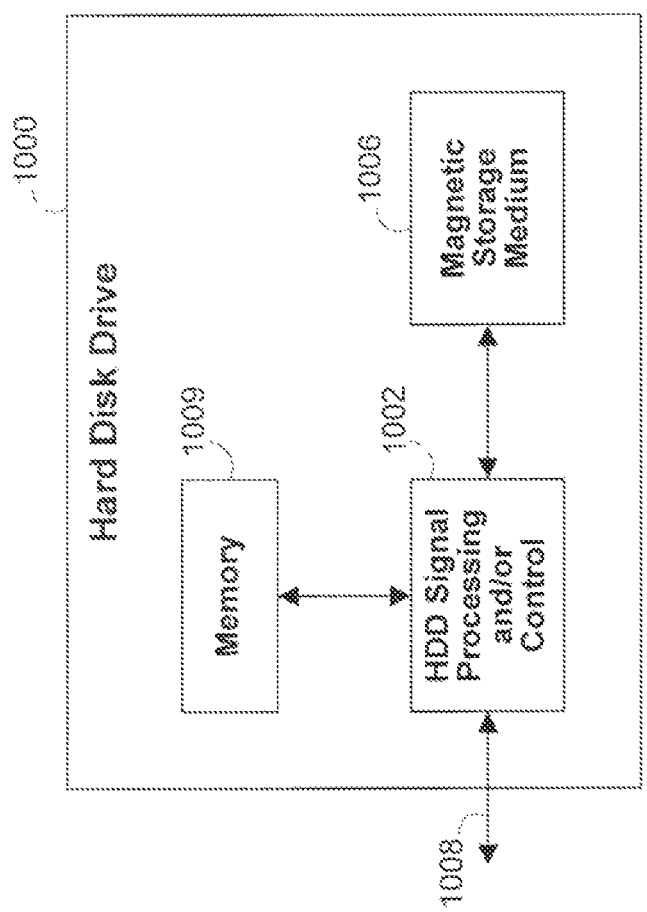
FIG. 10A is a block diagram of an exemplary hard disk drive that can employ the disclosed technology.

Referring now to FIG. 10A, the present invention can be implemented in a hard disk drive 1000. The present invention may implement either or both signal processing and/or control circuits, which are generally identified in FIG. 10A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 10B:
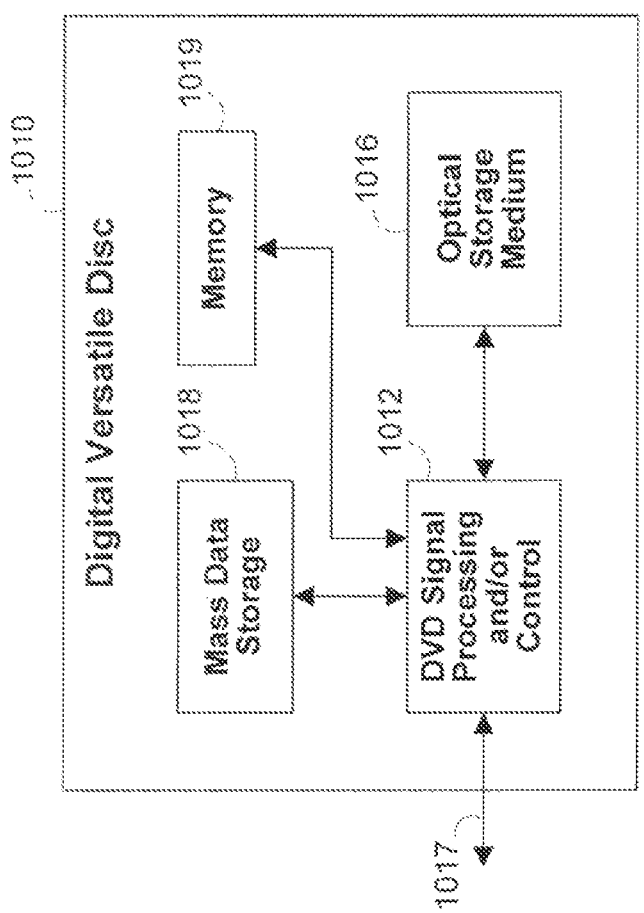
FIG. 10B is a block diagram of an exemplary digital versatile disc that can employ the disclosed technology.

Referring now to FIG. 10B, the present invention can be implemented in a digital versatile disc (DVD) drive 1010. The present invention may implement either or both signal processing and/or control circuits, which are generally identified in FIG. 10B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 10A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 10C:
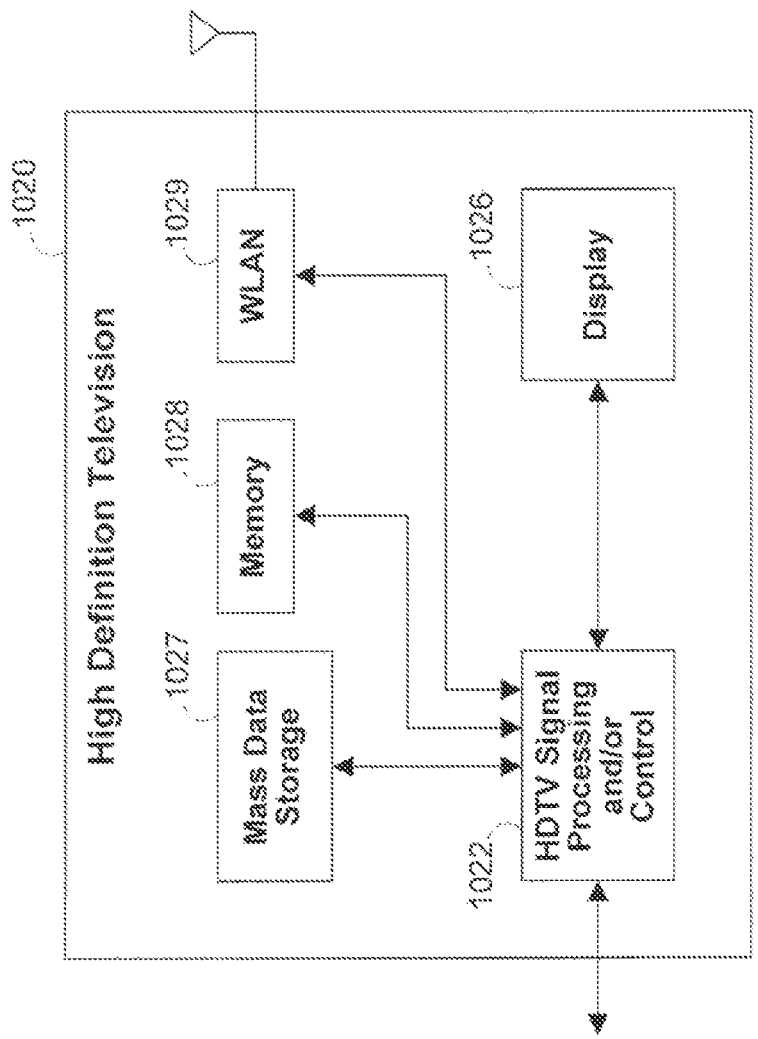
FIG. 10C is a block diagram of an exemplary high definition television that can employ the disclosed technology.

Referring now to FIG. 10C, the present invention can be implemented in a high definition television (HDTV) 1020. The present invention may implement either or both signal processing and/or control circuits, which are generally identified in FIG. 10C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 10D:
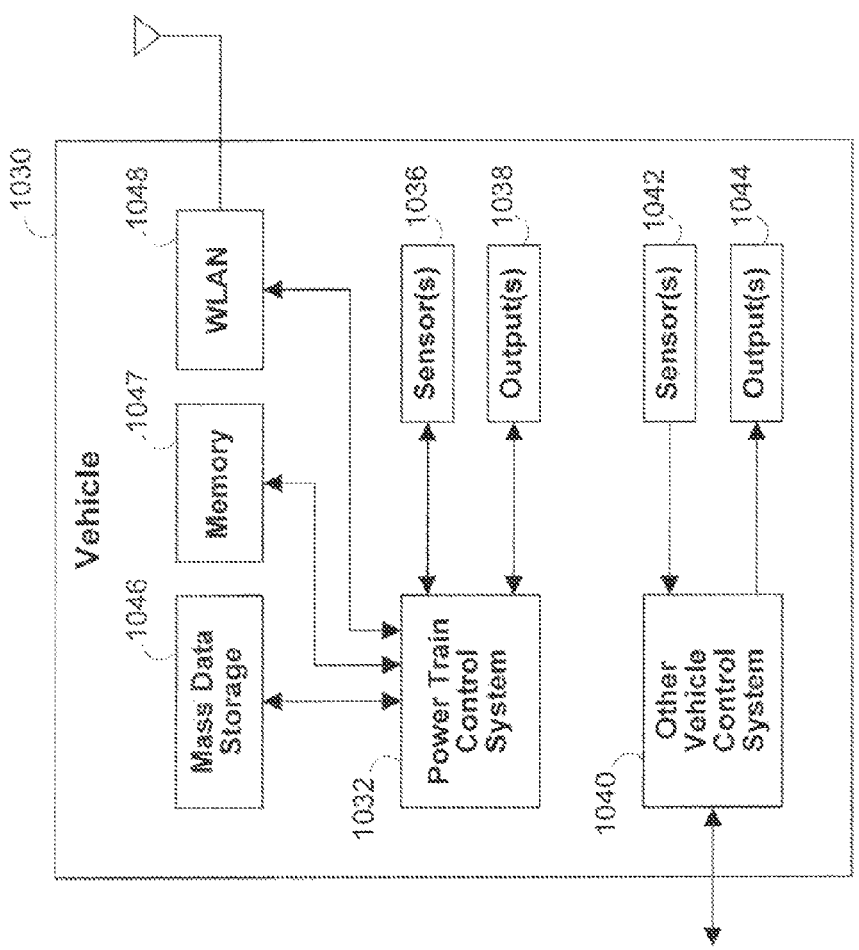
FIG. 10D is a block diagram of an exemplary vehicle that can employ the disclosed technology.

Referring now to FIG. 10D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 10E:
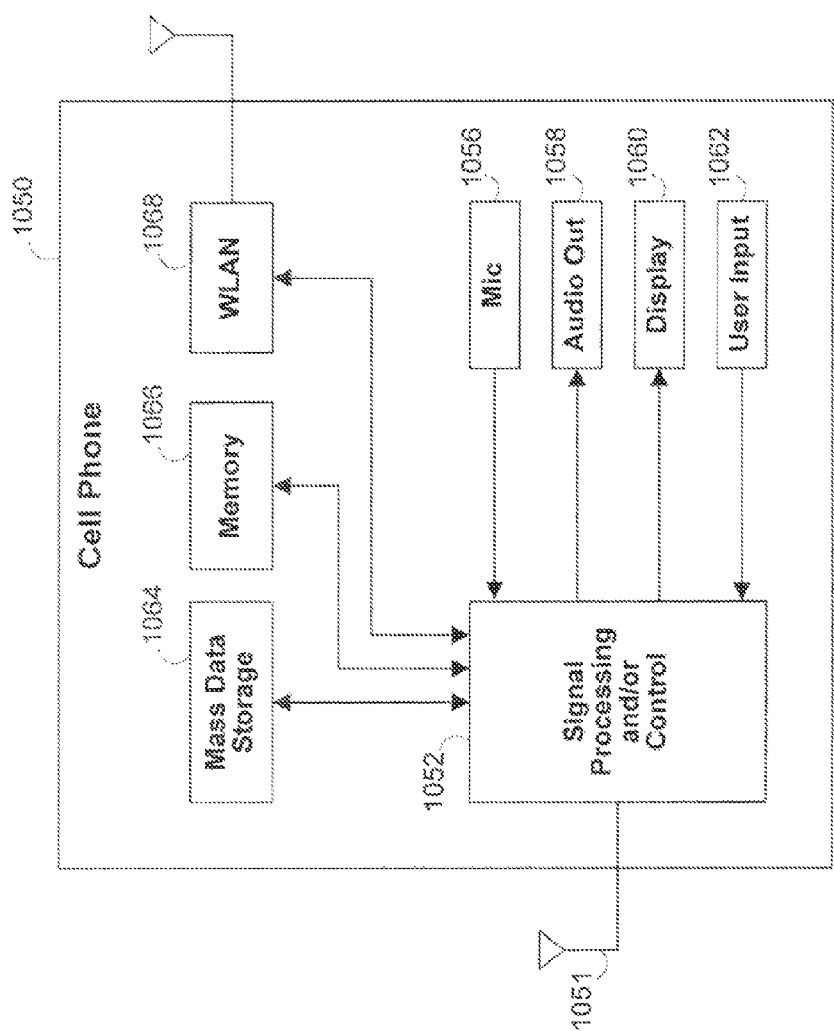
FIG. 10E is a block diagram of an exemplary cell phone that can employ the disclosed technology.

Referring now to FIG. 10E, the present invention can be implemented in a cellular phone 1050 that may include a cellular antenna 1051. The present invention may implement either or both signal processing and/or control circuits, which are generally identified in FIG. 10E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 10F:
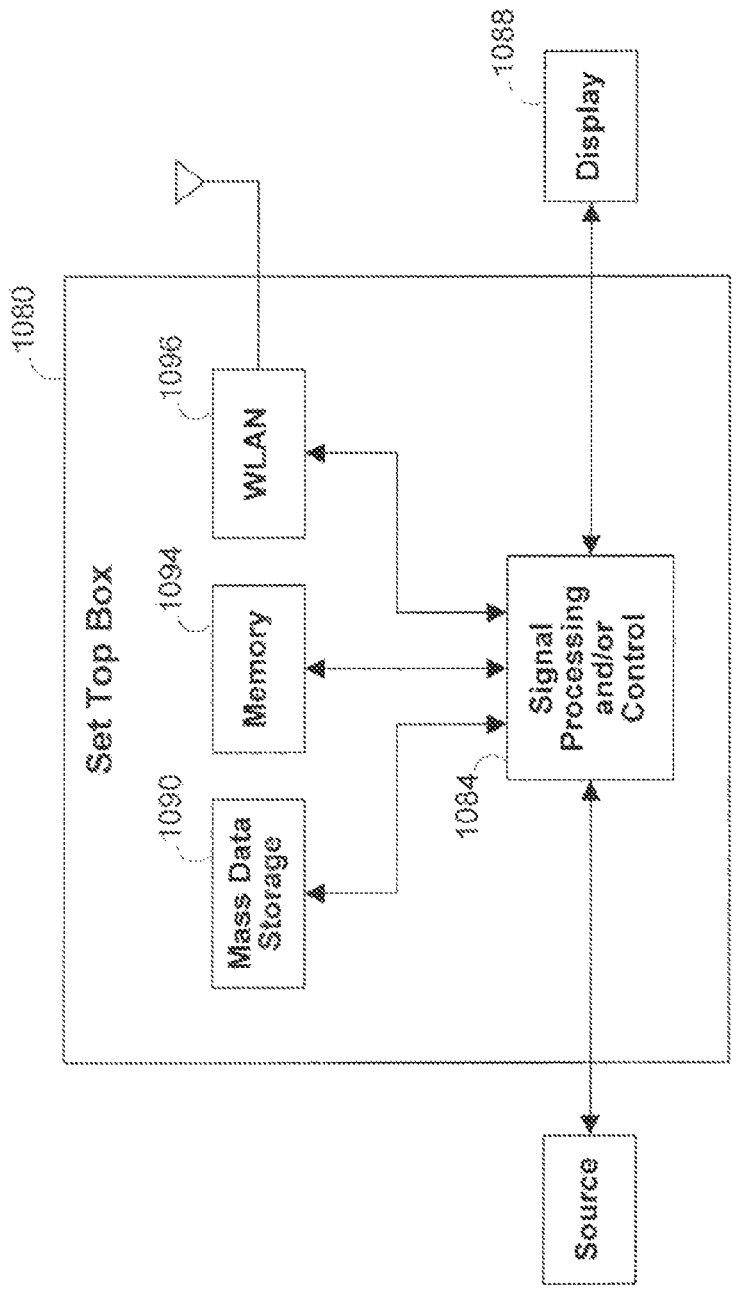
FIG. 10F is a block diagram of an exemplary set top box that can employ the disclosed technology.

Referring now to FIG. 10F, the present invention can be implemented in a set top box 1080. The present invention may implement either or both signal processing and/or control circuits, which are generally identified in FIG. 10F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 10G:
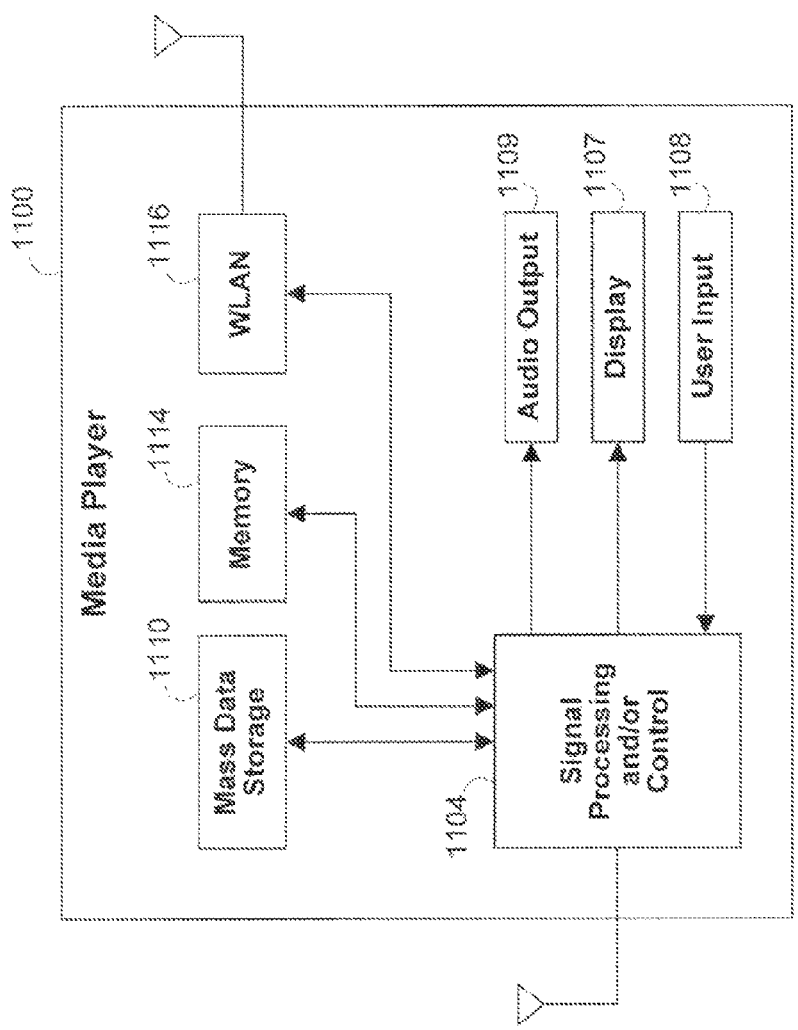
FIG. 10G is a block diagram of an exemplary media player that can employ the disclosed technology.

Referring now to FIG. 10G, the present invention can be implemented in a media player 1100. The present invention may implement either or both signal processing and/or control circuits, which are generally identified in FIG. 10G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Thus it is seen that methods and apparatus are provided for efficiently identifying the most likely set of error events that will correct errors that have been identified in data blocks. One skilled in the art will appreciate that the invention can be practiced by other than the described embodiments, which are presented for purposes of illustration and not of limitation, and the present invention is limited only by the claims which follow.

What is claimed is:

1. A method of decoding data blocks comprising:
    receiving a plurality of data blocks;
    retrieving a list of candidate error events from a memory, the list of candidate error events omitting a plurality of possible error events;
    generating a trellis that
        includes states corresponding to the error events in the list of candidate error events, and
        omits states corresponding to the plurality of possible error events;
    determining whether a first error event in the list of candidate error events is associated with first and second data blocks in the plurality of data blocks;
    assigning a branch metric to each path in the trellis connecting a pair of states, wherein at least one branch metric is assigned based on whether the first error event is associated with first and second data blocks; and
    detecting at least one error in the plurality of data blocks by performing a search on the trellis.

2. The method of claim 1, wherein the search is performed using a Viterbi algorithm.

3. The method of claim 1, further comprising updating at least one branch metric in response to the search reaching a corresponding data block boundary in the trellis.

4. The method of claim 1, further comprising processing the plurality of data blocks to generate a respective plurality of correction flags.

5. The method of claim 1, wherein an error event from the list of candidate error events spans a data block boundary.

6. The method of claim 1, further comprising detecting the at least one error by determining if correction of an error event associated with a data block in the plurality of data blocks will satisfy a correction flag associated with the data block.

7. The method of claim 1, further comprising generating a trailing bit position indicator corresponding to each error event in the list of candidate error events.

8. The method of claim 1, further comprising assigning the branch metric to each path in the trellis connecting a pair of states based on a correction flag associated with the respective pair of states.

9. The method of claim 1, further comprising determining if the first error event overlaps with a second error event associated with the second data block.

10. The method of claim 9, further comprising setting a branch metric associated with the first data block and the second data block to a maximum value for branch metrics in response to a determination that the first error event overlaps with the second error event.

11. The method of claim 1, wherein the trellis includes a branch connecting a first state and a second state, wherein the first state corresponds to two or more consecutive error events from the list of candidate error events.

12. A system for decoding data blocks comprising:
    a detector configured to receive a plurality of data blocks; and
    a decoder configured to:
        obtain a list of candidate error events, the list of candidate error events omitting a plurality of possible error events;
        generate a trellis that
            includes states corresponding to the error events in the list of candidate error events, and
            omits states corresponding to the plurality of possible error events;
        determine whether a first error event in the list of candidate error event is associated with first and second data blocks in the plurality of data blocks;
        assign a branch metric to each path in the trellis connecting a pair of states, wherein at least one branch metric is assigned based on whether the first error event is associated with first and second data blocks; and detect at least one error in the plurality of data blocks by performing a search on the trellis.

13. The system of claim 12, wherein the decoder is further configured to perform the search according to a Viterbi algorithm.

14. The system of claim 12, wherein the decoder is further configured to update at least one branch metric when the search reaches a corresponding data block boundary in the trellis.

15. The system of claim 12, further comprising a post-processor configured to process the plurality of data blocks to generate a respective plurality of correction flags.

16. The system of claim 12, wherein an error event from the list of candidate error events spans a data block boundary.

17. The system of claim 12, wherein the decoder is further configured to detect the at least one error by determining if correction of an error event associated with a data block in the plurality of data blocks will satisfy a correction flag associated with the data block.

18. The system of claim 12, wherein the decoder is further configured to generate a trailing bit position indicator corresponding to each error event in the list of candidate error events.

19. The system of claim 12, wherein the decoder is further configured to assign the branch metric to each path in the trellis connecting a pair of states based on a correction flag associated with the respective pair of states.

20. The system of claim 12, wherein the decoder is further configured to determine if the first error event overlaps with a second error event associated with the second data block.

21. The system of claim 20, wherein the decoder is further configured to set a branch metric associated with the first data block and the second data block to a maximum value for branch metrics in response to a determination that the first error event overlaps with the second error event.

22. The system of claim 12, wherein the decoder is further configured to generate the trellis so that the trellis includes a branch connecting a first state and a second state, wherein the first state corresponds to two or more consecutive error events from the list of candidate error events.

* * * * *